US006998920B2

(12) United States Patent
Krutko et al.

(10) Patent No.: US 6,998,920 B2
(45) Date of Patent: Feb. 14, 2006

(54) MONOLITHICALLY FABRICATED HBT AMPLIFICATION STAGE WITH CURRENT LIMITING FET

(75) Inventors: Oleh B. Krutko, Glen Gardner, NJ (US); Aditya K. Gupta, Silver Spring, MD (US); M. Ali Khatibzadeh, Hampton, NJ (US); Kezhou Xie, Edison, NJ (US)

(73) Assignee: Anadigics Inc., Warren, NJ (US)

( * ) Notice: Subject to any disclaimer, the term of this patent is extended or adjusted under 35 U.S.C. 154(b) by 47 days.

(21) Appl. No.: 10/783,825

(22) Filed: Feb. 20, 2004

(65) Prior Publication Data

US 2005/0184808 A1 Aug. 25, 2005

(51) Int. Cl.
*H02H 7/20* (2006.01)

(52) U.S. Cl. ....................................... 330/298; 330/296

(58) Field of Classification Search ................ 330/289, 330/288, 296, 285, 298; 257/370, 378, 509; 437/31, 57, 59

See application file for complete search history.

(56) References Cited

U.S. PATENT DOCUMENTS

| | | | | | |
|---|---|---|---|---|---|
| 5,470,766 | A | * | 11/1995 | Lien | 438/419 |
| 5,652,456 | A | * | 7/1997 | Lien | 257/370 |
| 5,923,070 | A | * | 7/1999 | Yamada | 257/408 |
| 6,617,928 | B1 | * | 9/2003 | Finlay et al. | 330/288 |
| 6,870,427 | B1 | * | 3/2005 | Cathelin et al. | 330/296 |
| 6,873,211 | B1 | * | 3/2005 | Thompson et al. | 330/285 |

OTHER PUBLICATIONS

W.J. Ho, M.F. Chang, S.M. Beccue, P.J. Zampardi, J. Yu, A. Sailer, R.L. Pierson, K.C. Wang, "A GaAs BiFET LSI technology", GaAs IC Sym. Tech. Dig., 1994, p. 47, "no month".

D. Cheskis, C. E. Chang, W. H. Ku, P. M. Asbeck, M.F. Chang, R.L. Pierson, S. Sailer,"Co-integration of GaAlAs/GaAs HBT's and GaAs FET's with a simple manufacturable process", IEDM Tech. Dig., 1992, p. 91, "no month".

D. C. Streit, D. K. Umemoto, K. W. Kobayashi, A. K. Oki, "Monolithik HEMT-HBT integration by selective MBE". IEEE Trans. Electron Devices, vol. 42, 1995, p. 618, "no month".

D. C. Streit, D. K. Umemoto, J. R. Velebir, K. W. Kobayashi, A. K. Oki, "35 GHz HEMT amplifiers fabricated using integration HEMT-HBT material grown by selective MBE", IEEE Microwave Guided Wave Lett., vol. 4, 1994, p. 361, "no month".

K. Itakura, Y. Shimamoto, T. Ueda, S. Katsu, D. Ueda, "A GaAs Bi-FET technology for large scale integration", IEDM Tech. Dig., 1989, p. 389, "no month".

Y. F. Yang, C.C. Hsu, E.S. Yang, "Integration of GaInP/GaAs heterojunction bipolar transistors and high electron mobility transistors", IEEE Electron Device Lett., vol. 17, No. 7, Jul. 1996, p. 363.

J. H. Tsai, "Integrated fabrication of InGaP/GaAs d-doped heterojunction bipolar transistor and doped-channel field effect transistor", 2002 IEEE, p. 365, "no month".

J. Jang, E. C. Kan, T. Arnborg, T. Johansson, R. Dutton, "Characterization of RF Power BJT and Improvement of Thermal Stability with Nonlinear Base Ballasting", 1998 IEE, p. 1428, "no month".

* cited by examiner

*Primary Examiner*—Don Le
*Assistant Examiner*—Lam T. Mai
(74) *Attorney, Agent, or Firm*—Morgan, Lewis & Bockius LLP

(57) ABSTRACT

A monolithically integrated amplifier comprising at least one heterojunction bipolar transistor and at least one field effect transistor is disclosed wherein the field effect transistor provides improved ruggedness by limiting the base and/or collector current to the HBT during severe load mismatch and/or high overdrive.

25 Claims, 16 Drawing Sheets

MONOLITHICALLY FABRICATED HBT AMPLIFICATION STAGE WITH CURRENT LIMITING FET

BACKGROUND OF THE INVENTION

1. Field of the Invention

This invention relates to monolithic amplifiers suitable primarily for handling microwave or radio-frequency (RF) signals. In particular, the invention relates to the design of bipolar transistor microwave/RF amplifiers that are resistant to severe load mismatch and/or high overdrive conditions.

2. Description of Related Art

Wireless handset power amplifiers often include one or more heterojunction bipolar transistors (HBTs) that provide efficient amplification at the high frequencies of present wireless systems. HBTs generally comprise several smaller HBTs connected in parallel. The smaller HBTs, also referred to as cells, may be identical to each other but may also differ to the other cells in the HBT depending on design considerations. Generally, HBTs are preferred over bipolar junction transistors (BJTs) because of the higher gain, higher breakdown voltage, and higher saturation velocity of the HBT. GaAs HBTs are preferred over silicon, despite their greater cost, because the high electron mobility in GaAs enables GaAs HBTs to operate at the gigahertz frequencies of our present wireless systems. HBTs, however, may fail from thermal runaway brought on by a severe load mismatch and/or high overdrive condition. The Wireless GSM standard requires that the amplification stage survive a 10:1 Voltage Standing Wave Ratio (VSWR) mismatched load at all phases under full RF drive and high collector voltage, which is normally higher than 4.5 V. Under such conditions, the load line is distorted and there are significant increases in the collector and base currents through the HBT. The large collector and base currents cause self-heating in the HBT and increase the dissipated power. If the dissipated power exceeds a threshold, the HBT undergoes thermal runaway and is irreversibly damaged.

FIG. 1 illustrates a typical HBT amplification stage where the base 120 of the HBT 125 is biased with constant voltage at 110, $V_{IN}$, through a lumped resistor 112, $R_1$, and a distributed ballast resistor 114, $R_2$. As used hereinafter, a distributed resistor is a resistor that is electrically connected to each cell comprising the HBT. Input RF power at terminal 105, $RF_{in}$, is supplied through blocking capacitor 107 separating the DC and RF input lines. An additional distributed resistor 116, $R_3$, is placed in the RF path of the base for stability.

Collector current or voltage clipping circuits are added to the circuit shown in FIG. 1 to limit the collector and base currents through the HBT. Such circuits are usually implemented in silicon complementary metal oxide semiconductor (Si-CMOS) because of cost considerations. Such a design requires a combination of GaAs HBT with a Si CMOS or other hybrid approaches. These hybrid approaches result in higher manufacturing costs and may even place a lower limit on possible device sizes. Therefore, there remains a need for monolithic RF/microwave power amplifiers that are capable of surviving severe load mismatch or overdrive conditions.

SUMMARY OF THE INVENTION

One embodiment of the present invention is directed to a monolithically integrated amplifier comprising: a heterojunction bipolar transistor (HBT) comprising a contact epitaxial layer; and a field effect transistor (FET) configured to current-limit a current to the HBT, the FET comprising a portion of the contact epitaxial layer. In some embodiments of the invention, the FET is gated, while in others it is ungated. In some embodiments, the FET is configured in series with a base of the HBT. In some embodiments, the FET is configured in series between a collector of the HBT and voltage source. In some embodiments, the FET is configured in series between an output and a RF connection to a collector of the HBT.

Another embodiment of the present invention is directed to a monolithically integrated amplifier comprising: a heterojunction bipolar transistor (HBT) comprising at least one HBT cell, the HBT cell comprising a contact epitaxial layer; and a field effect transistor (FET) configured to current-limit a current to the at least one HBT cell, the FET comprising a portion of the contact epitaxial layer.

BRIEF DESCRIPTION OF THE DRAWINGS

The invention will be described by reference to preferred and alternative illustrative embodiments thereof in conjunction with the drawings in which.

DETAILED DESCRIPTION

Figure 2:
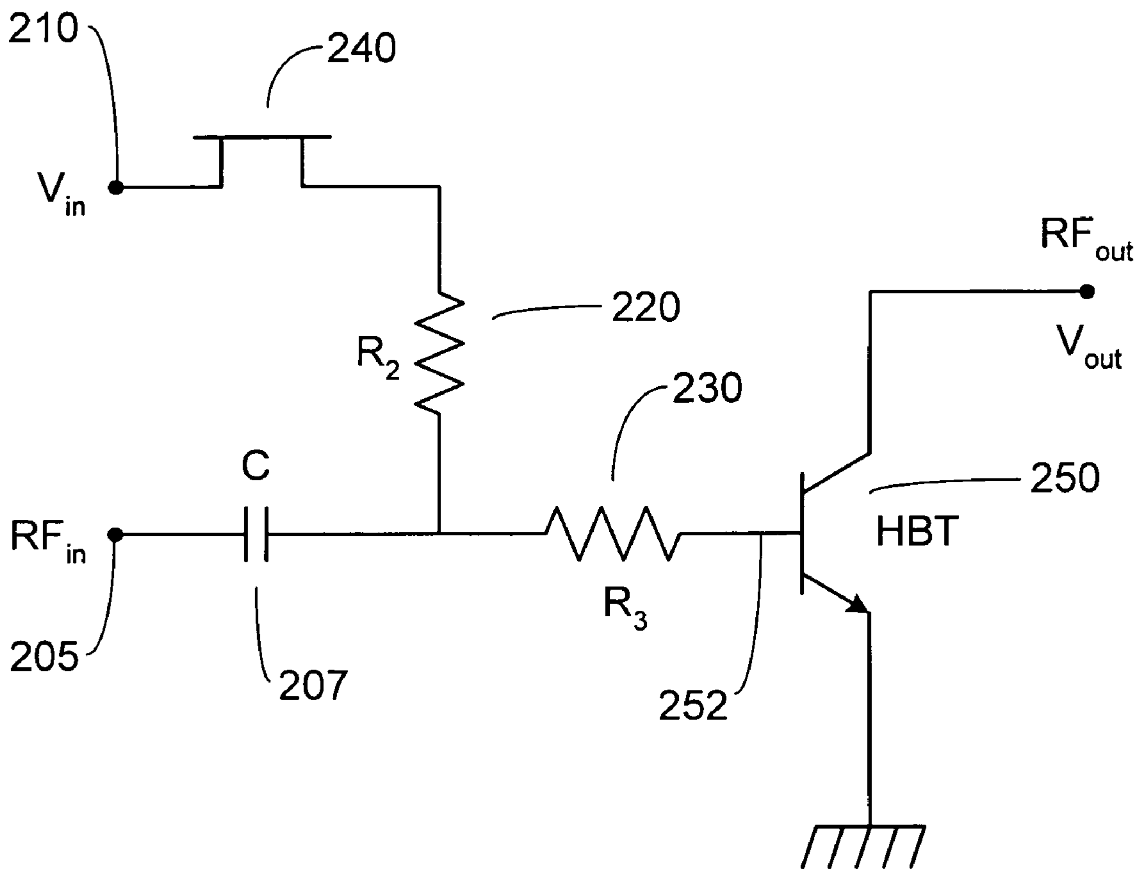
FIG. 2 is a circuit schematic of an HBT amplification stage in one embodiment of the present invention.

FIG. 2 is a circuit schematic of an HBT amplification stage in accordance with one embodiment of the present invention. In FIG. 2, the base 252 of the HBT 250 is biased with constant voltage at terminal 210, $V_{IN}$, through an ungated FET 240 and a distributed ballast resistor 220, $R_2$. Input RF power 205 is supplied through blocking capacitor 207 separating the DC and RF input lines. An additional distributed resistor 230, $R_3$, may be placed in the RF path of the base for stability. In addition to biasing the HBT 250, resistors 220, 230 may be selected such that FET 240 operates in its linear region during normal operation of the HBT 250.

The FET shown in FIG. 2 may be a MOSFET but other types of field effect transistor, such as for example MESFETs or HEMTs, may be used and are within the scope of the present invention. In some embodiments, the physical characteristics of the FET, such as for example, channel dimensions, gate characteristics, and doping levels, may be selected to set the resistance, $R_{on}$, of the FET 240 when operated in the linear region of operation. For the same doping level and thickness, $R_{on}$ is proportional to the source-to-drain spacing, which may be made very small for an ungated FET such as, for example a pHEMT. In some embodiments, the effective resistance of the FET 240 is set to limit the base current to the HBT 250 to a design nominal value, $I_{Bnom}$, such that the HBT 250 is biased properly. $I_{Bnom}$ is the base current of the HBT in matched condition where the optimum load to presented to the transistor such that the reflected power is minimum.

In some embodiments, the width of the FET channel is selected to set the maximum allowed DC current, $I_{Dsat}$, through the FET using methods known to one of skill in the semiconductor device art. For example, S. M. Sze, "Semiconductor Devices: Physics and Technology," 2nd Ed., John Wiley & Sons, Inc. (2002) at pp. 186–199, herein incorporated by reference, describes the relation between channel width and $I_{Dsat}$.

In a preferred embodiment, $I_{Dsat}$ is set such that $I_{Dsat}$ is in the range of one to two times larger than $I_{Bnom}$. Setting $I_{Dsat}$ larger than $I_{Bnom}$ avoids degrading performance during nominal operation. Setting $I_{Dsat}$ less than $2*I_{Bnom}$ prevents uncontrolled current increases during mismatch or overdrive conditions, thereby preventing irreversible damage to the HBT 250.

Figure 3:
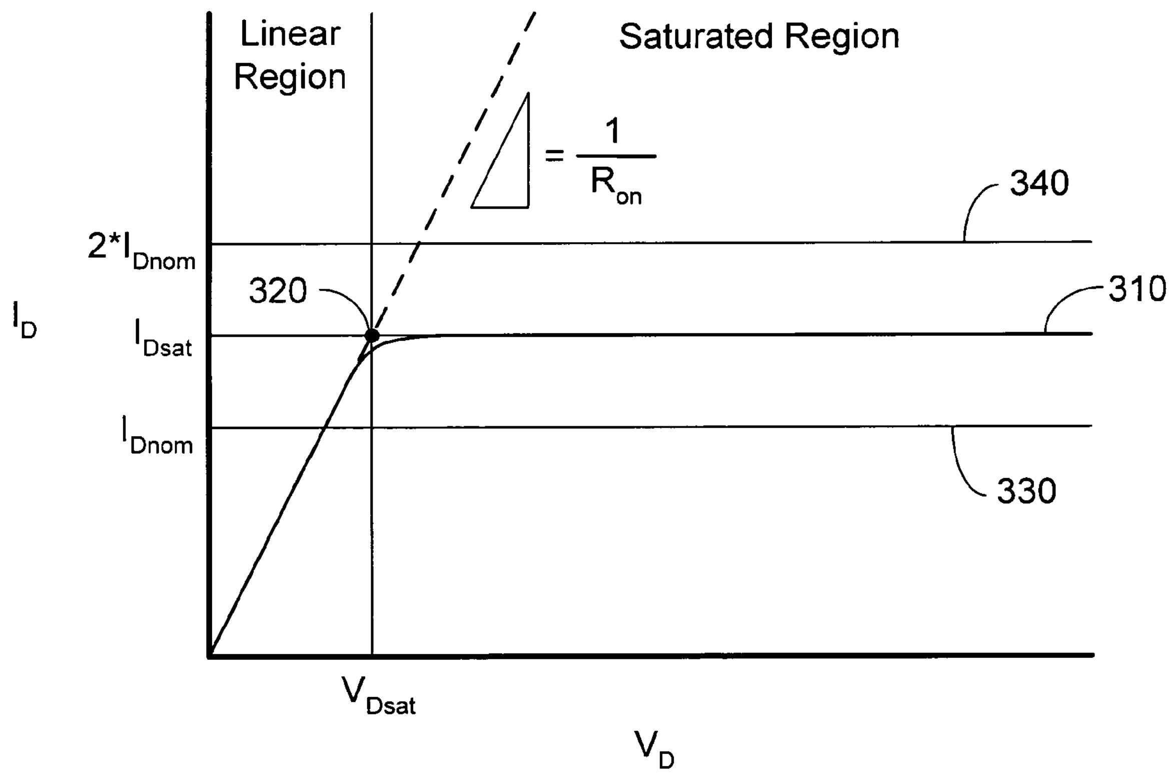
FIG. 3 illustrates the drain current-voltage characteristics of the FET.

FIG. 3 illustrates the drain current-voltage characteristics of the FET. The drain characteristic 310 has a linear region and a saturation region separated by point 320 where the current is equal to $I_{Dsat}$ and the voltage is $V_{Dsat}$. When the FET is operating in the linear region, it behaves as a resistor with a resistance, $R_{on}$. In the saturation region, the drain current is limited to $I_{Dsat}$ independent of the drain voltage, which is greater than $V_{Dsat}$. Therefore, the maximum current delivered to the base of the HBT is $I_{Dsat}$. $I_{Dsat}$ is selected to be in the range from $I_{Bnom}$ to $2*I_{Bnom}$, indicated by 330 and 340, respectively.

Figure 4:
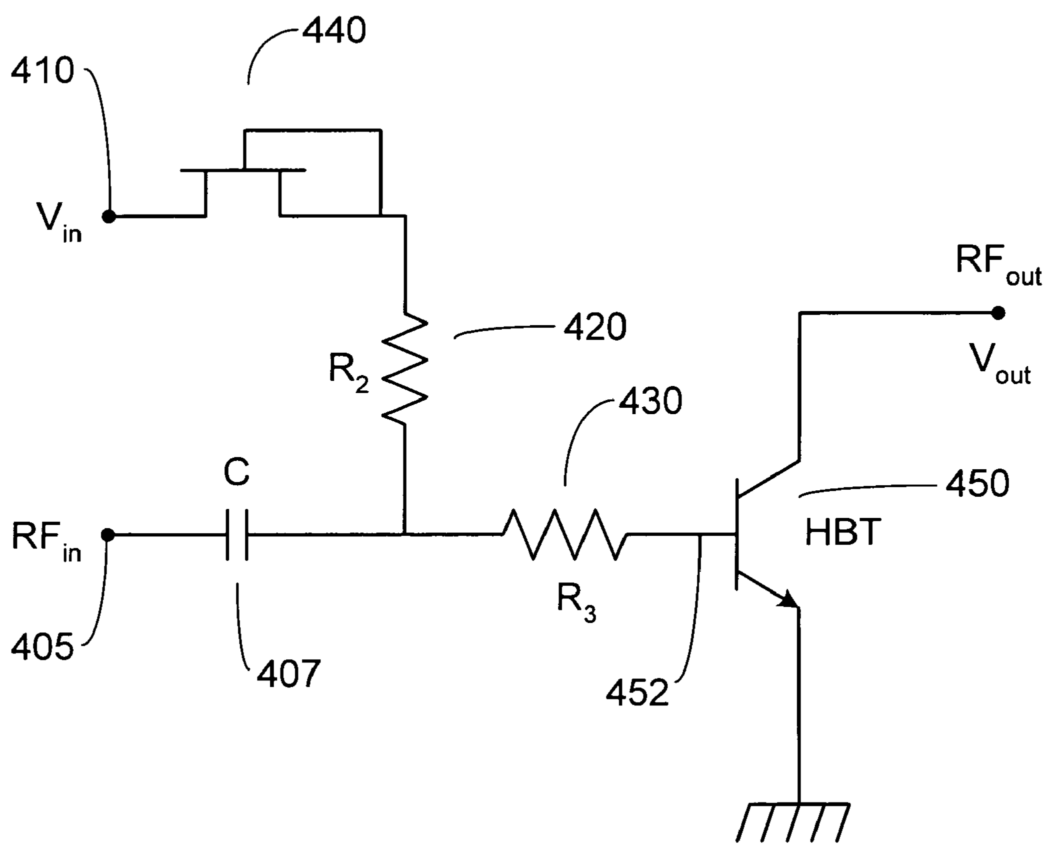
FIG. 4 is a circuit schematic of an HBT amplification stage in another embodiment of the present invention.

FIG. 4 is a circuit schematic of an HBT amplification stage in another embodiment of the present invention. In FIG. 4, the base 452 of the HBT 450 is biased with constant voltage at terminal 410, $V_{IN}$, through a gated FET 440 and a distributed ballast resistor 420, $R_2$. Input RF power 405 is supplied through blocking capacitor 407 separating the DC and RF input lines. An additional distributed resistor 430, $R_3$, may be placed in the RF path of the base for stability.

Gated FET 440 ties the gate potential to the drain potential of the FET 440 and uniquely defines the gate potential and reduces the variation in gate potential normally associated with an ungated FET. With the gate potential defined, a High Electron Mobility Transistor (HEMT) may be used to provide better uniformity and low $R_{on}$.

The FET shown in FIG. 4 may be a MOSFET but other types of field effect transistor, such as for example MESFETs or HEMTs, may be used and are within the scope of the present invention. In some embodiments, the physical characteristics of the FET, such as for example channel dimensions, gate characteristics, and doping levels, may be selected to set the effective resistance of the FET 440 when operated in the linear region of operation. In some embodiments, the effective resistance of the FET 440 is set to limit the base current to the HBT 450 to a design nominal value, $I_{Bnom}$, such that the HBT is biased properly.

In some embodiments, the width of the FET channel is selected to set the maximum allowed DC current, $I_{Dss}$, through the FET using methods known to one of skill in the semiconductor device art. In a preferred embodiment, $I_{Dss}$ is set such that $I_{Dss}$ is in the range of one to two times larger than $I_{Bnom}$. Setting $I_{Dss}$ larger than $I_{Bnom}$ avoids degrading performance during nominal operation. Setting $I_{Dss}$ less than $2*I_{Bnom}$ prevents uncontrolled current increases during mismatch or overdrive conditions, thereby preventing irreversible damage to the HBT 450.

FET 440 may be fabricated on the same die as HBT 450, resulting in a monolithic amplifier design of reduced size and manufacturing cost compared to designs where the FET and HBT are fabricated on separate dies. The monolithic fabrication of the HBT/FET circuit may use any of the methods known to one of skill in the art. In a preferred embodiment, it is fabricated according to the methods disclosed in co-pending U.S. patent application entitled, "Structures and Methods for Fabricating Manufacturable Integrated HBT/FET,"Ser. No. 10/783,830, herein incorporated by reference in its entirety.

Figure 5:
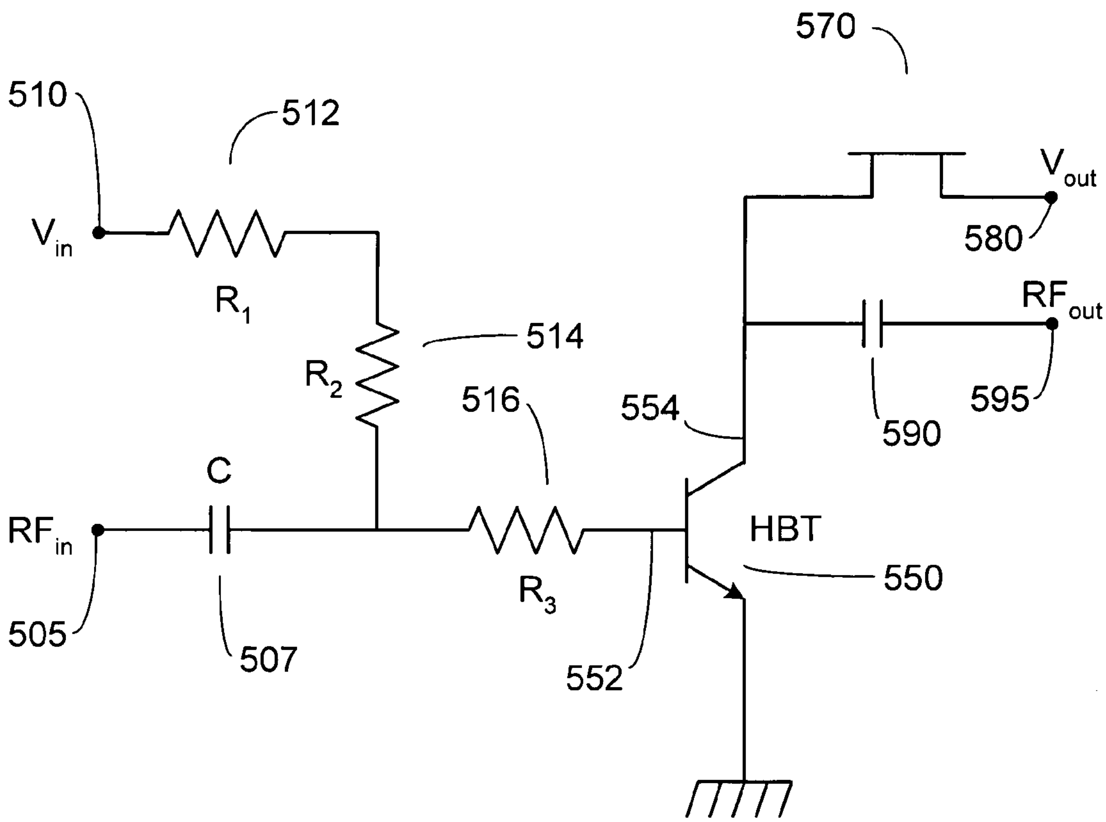
FIG. 5 is a circuit schematic of an HBT amplification stage in another embodiment of the present invention.

FIG. 5 is a circuit schematic of an HBT amplification stage in another embodiment of the present invention. In FIG. 5, the base 552 of the HBT 550 is biased with constant voltage at terminal 510, $V_{IN}$, through a lumped resistor 512, $R_1$, and a distributed ballast resistor 514, $R_2$. Input RF power 505 is supplied through blocking capacitor 507 separating the DC and RF input lines. An additional distributed resistor 516, $R_3$, may be placed in the RF path of the base for stability. RF output 595 is coupled to the collector 554 of HBT 550 through blocking capacitor 590. The DC component of $V_{out}$ 580 is connected to the source of an ungated FET 570. The drain of FET 570 is connected to the collector of HBT 550. In some embodiments, the saturation current, $I_{Dsat}$, of FET 570 is set to a value between $I_{Cnom}$ and $2*I_{Cnom}$, where $I_{Cnom}$ is the HBT collector current under matched load conditions.

Figure 6:
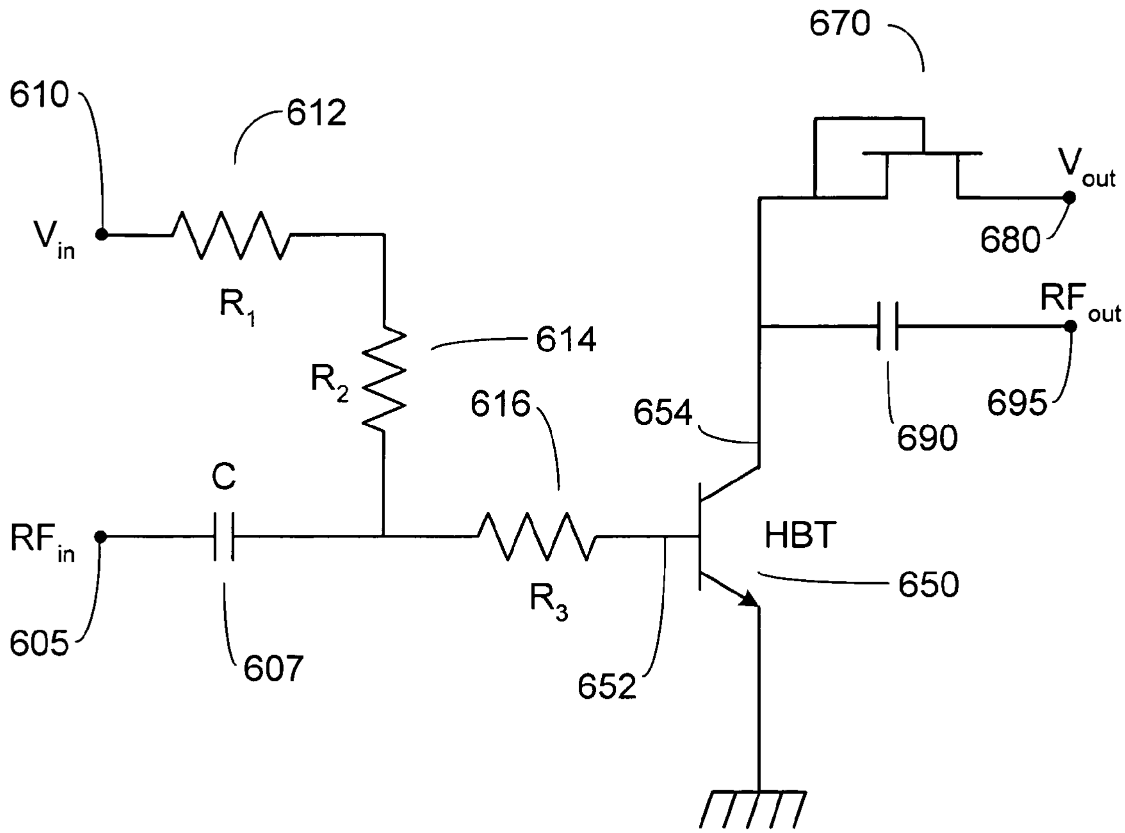
FIG. 6 is a circuit schematic of an HBT amplification stage in another embodiment of the present invention.

FIG. 6 is a circuit schematic of an HBT amplification stage in another embodiment of the present invention. In FIG. 6, the base 652 of the HBT 650 is biased with constant voltage at terminal 610, $V_{IN}$, through a lumped resistor 612, $R_1$, and a distributed ballast resistor 614, $R_2$. Input RF power 605 is supplied through blocking capacitor 607 separating the DC and RF input lines. An additional distributed resistor 616, $R_3$, may be placed in the RF path of the base for stability. RF output 595 is coupled to the collector 654 of HBT 550 through blocking capacitor 690. The DC component of $V_{out}$ 680 is connected to the source of a gated FET 670. The drain of FET 670 is connected to the collector of HBT 650. In some embodiments, the saturation current, $I_{Dss}$, of FET 670 is set to a value between $I_{Cnom}$ and $2*I_{Cnom}$, where $I_{Cnom}$ is the HBT collector current under matched load conditions.

Figure 7:
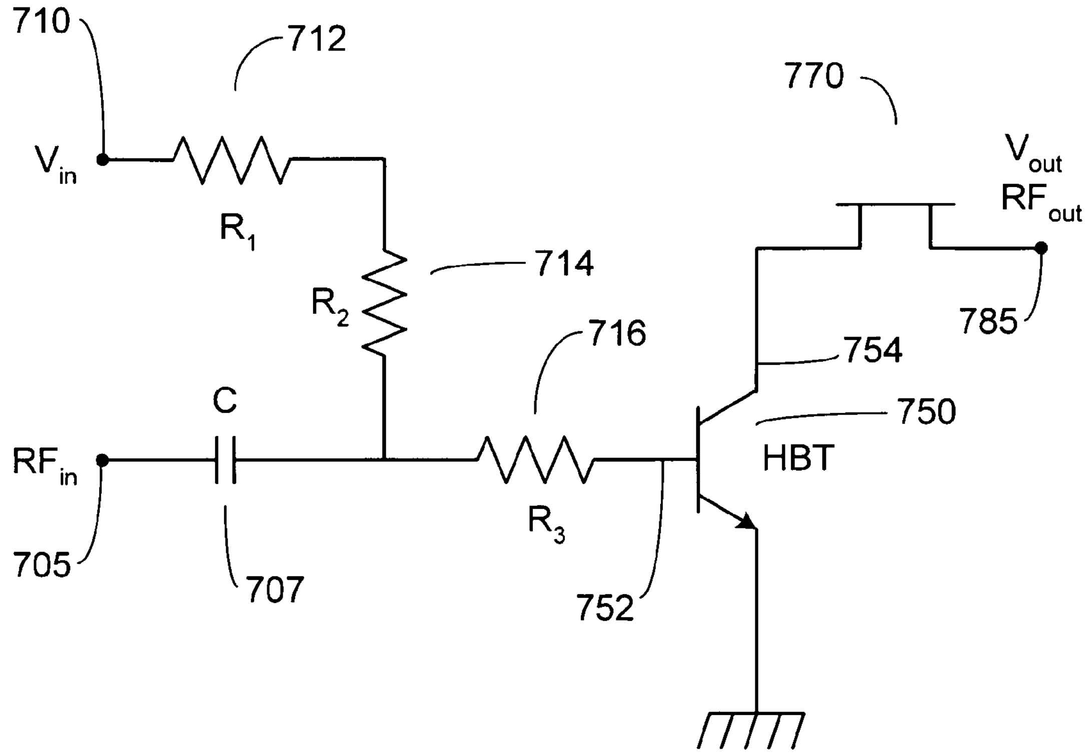
FIG. 7 is a circuit schematic of an HBT amplification stage in another embodiment of the present invention.

FIG. 7 is a circuit schematic of an HBT amplification stage in another embodiment of the present invention. In FIG. 7, the base 752 of the HBT 750 is biased with constant voltage at terminal 710, $V_{IN}$, through a lumped resistor 712, $R_1$, and a distributed ballast resistor 714, $R_2$. Input RF power is supplied at terminal 705 through blocking capacitor 707 separating the DC and RF input lines. An additional distributed resistor 716, $R_3$, may be placed in the RF path of the base for stability. The RF and DC output at terminal 785 is coupled to the collector 754 of HBT 750 through an ungated FET 770. In some embodiments, the saturation current, $I_{Dsat}$, of FET 770 is set to a value between $2*I_{Cnom}$ and $4*I_{Cnom}$, where $I_{Cnom}$ is the HBT collector current under matched load conditions.

Figure 8:
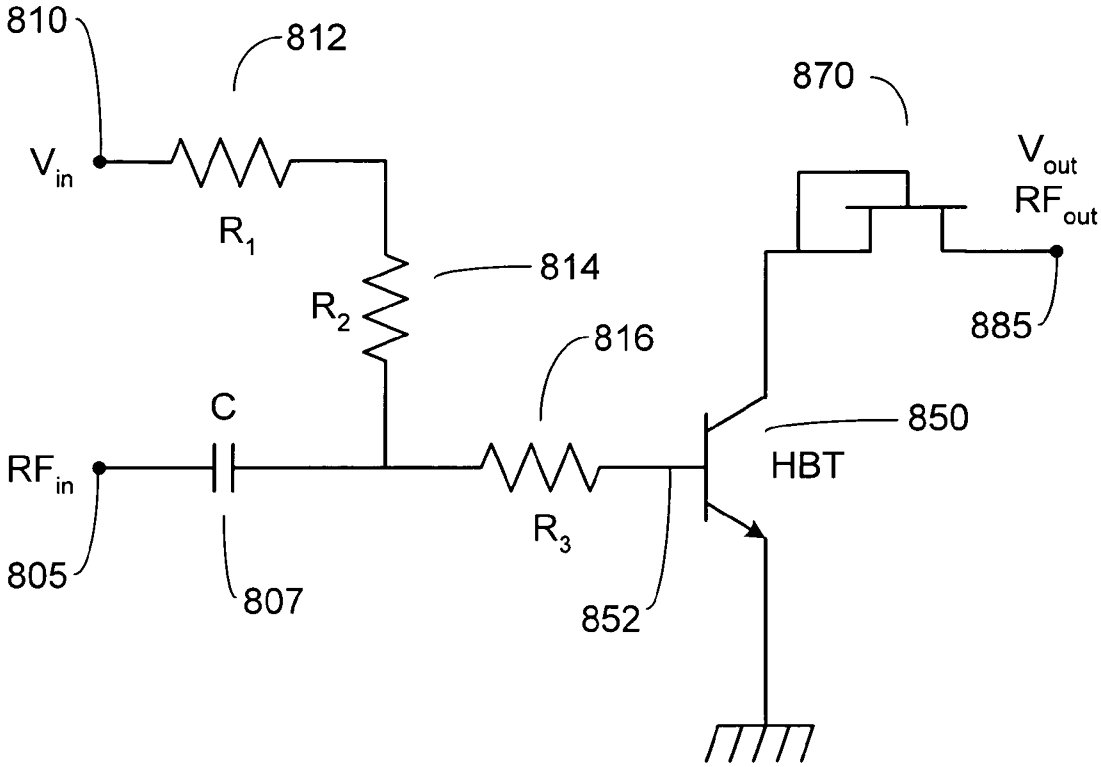
FIG. 8 is a circuit schematic of an HBT amplification stage in another embodiment of the present invention.

FIG. 8 is a circuit schematic of an HBT amplification stage in another embodiment of the present invention. In FIG. 8, the base 852 of the HBT 850 is biased with constant voltage at terminal 810, $V_{IN}$, through a lumped resistor 812, $R_1$, and a distributed ballast resistor 814, $R_2$. Input RF power to terminal 805 is supplied through blocking capacitor 807 separating the DC and RF input lines. An additional distributed resistor 816, $R_3$, may be placed in the RF path of the base for stability. The RF and DC output at terminal 885 is coupled to the collector 854 of HBT 850 through a gated FET 870. In some embodiments, the saturation current, $I_{Dsat}$, of FET 870 is set to a value between $2*I_{Cnom}$ and $4*I_{Cnom}$, where $I_{Cnom}$ is the HBT collector current under matched load conditions.

In accordance with some embodiments of the invention the FET may be fabricated on the same substrate as the HBT resulting in a monolithic amplifier design thereby reducing the size and manufacturing cost of the amplifier. The monolithic fabrication of the HBT/FET circuit may use any of the methods known to one of skill in the art. In a preferred embodiment, the HBT/FET amplifier is fabricated according to the methods disclosed in co-pending U.S. patent application entitled, "Structures and Methods for Fabricating Manufacturable Integrated HBT/FET," Ser. No. 10/783,830, herein incorporated by reference in its entirety.

Figure 9:
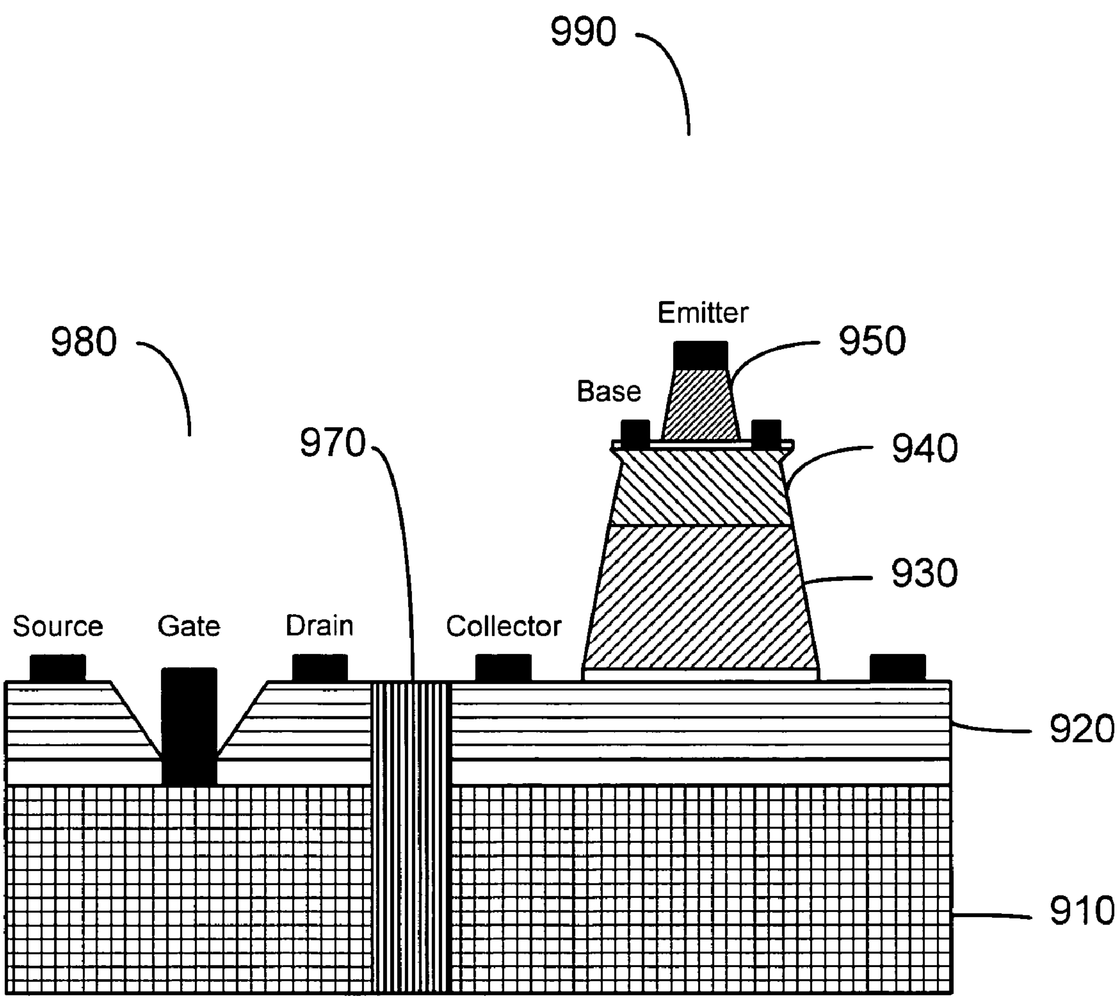
FIG. 9 is a schematic cross-section view of a monolithic structure integrating both the HBT and FET onto the same substrate.

FIG. 9 is a schematic cross-sectional view of a monolithic structure integrating both the HBT and FET onto the same substrate. A FET epitaxial layer 910 sits atop a substrate, not shown. A contact epitaxial layer 920 is disposed on the FET layer and comprises a portion of the FET 980 and HBT 990. An isolation barrier 970 electrically isolates the FET 980 from the HBT 990 such that the FET portion of the contact epitaxial layer may be modified independently of the HBT portion of the contact epitaxial layer thereby allowing for better and separate control of the FET and the HBT operating characteristics. A collector layer 930 is disposed on top of the HBT portion of the contact layer 920. A base layer 940 is disposed on top of the collector layer 930. An emitter layer 950 is disposed on top of the base layer 940 and together with the base layer 940 and collector layer 930 forms the HBT. The fabrication details used to produce the structure illustrated in FIG. 9 are disclosed in the co-pending application entitled, "Structures and Methods for Fabricating Manufacturable Integrated HBT/FET."

An advantage of fabricating the HBT and FET on the same substrate is that each cell in the HBT may have its own current limiting FET, which is generally more effective than controlling the overall current of the amplifier stage by a single FET.

The invention having been described, the following examples are presented to illustrate, rather than to limit the scope of the invention. Examples 1 and 2 illustrate engineering proof-of-principle of the HBT/FET design for a single stage amplifier and for a three-stage quad-band GSM power amplifier.

EXAMPLE 1

Figure 1:
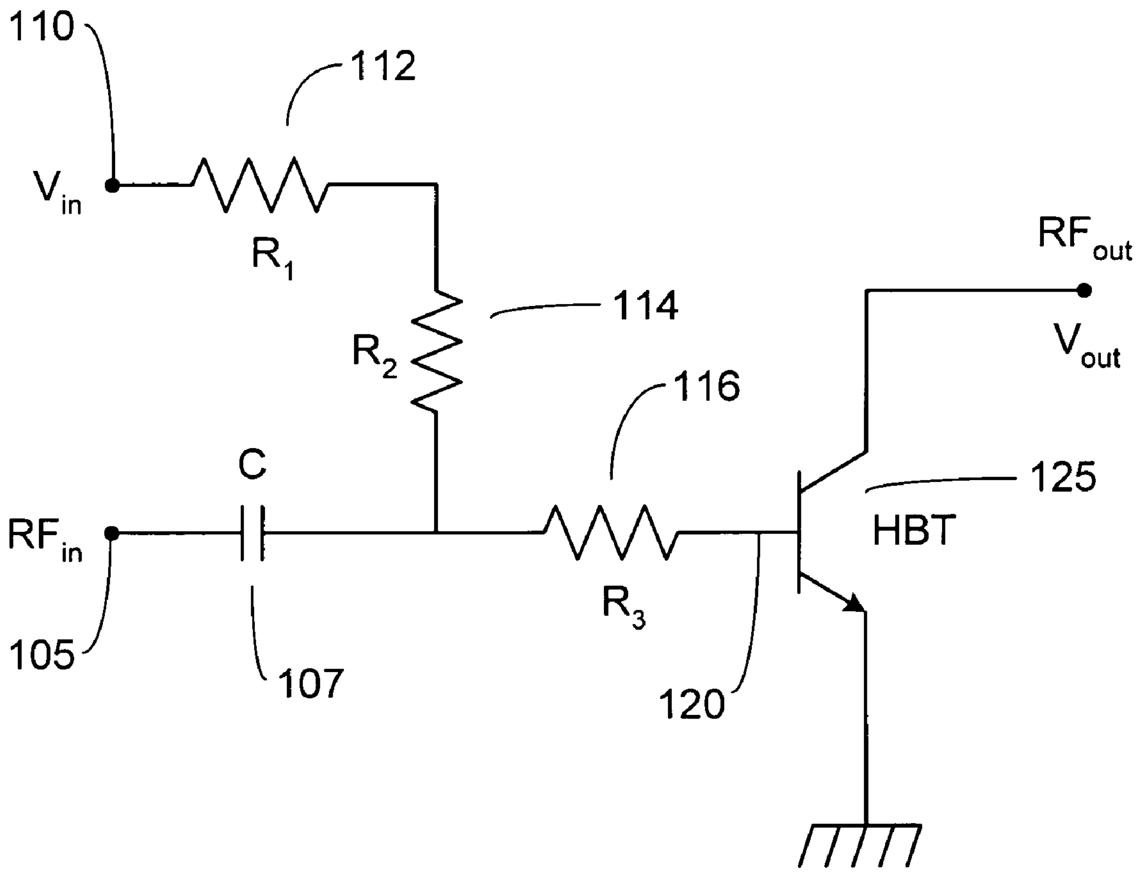
FIG. 1 illustrates an HBT amplification stage.

A standard amplification stage such as that shown in FIG. 1 was fabricated. An FET current-limited amplification stage such as that shown in FIG. 2 was fabricated where the lumped resistor was replaced by a current limiting FET in the base DC path. The HBTs in both amplification stages were fabricated to have a total emitter area of about 1200 $\mu m^2$ and were each composed of 20 cells, each cell having an area of about 60 $m^2$. Both amplification stages used a distributed resistor, $R_3$, of 5 Ω, a distributed ballast resistor, $R_2$, of 25 Ω, and a blocking capacitor of 6 pF. The standard amplification stage used a lumped resistor, $R_1$, of 50 Ω. The FET in the second amplification stage was fabricated such that the width of the FET was 25 $\mu$m with a recess length of 0.8 $\mu$m.

Figure 10:
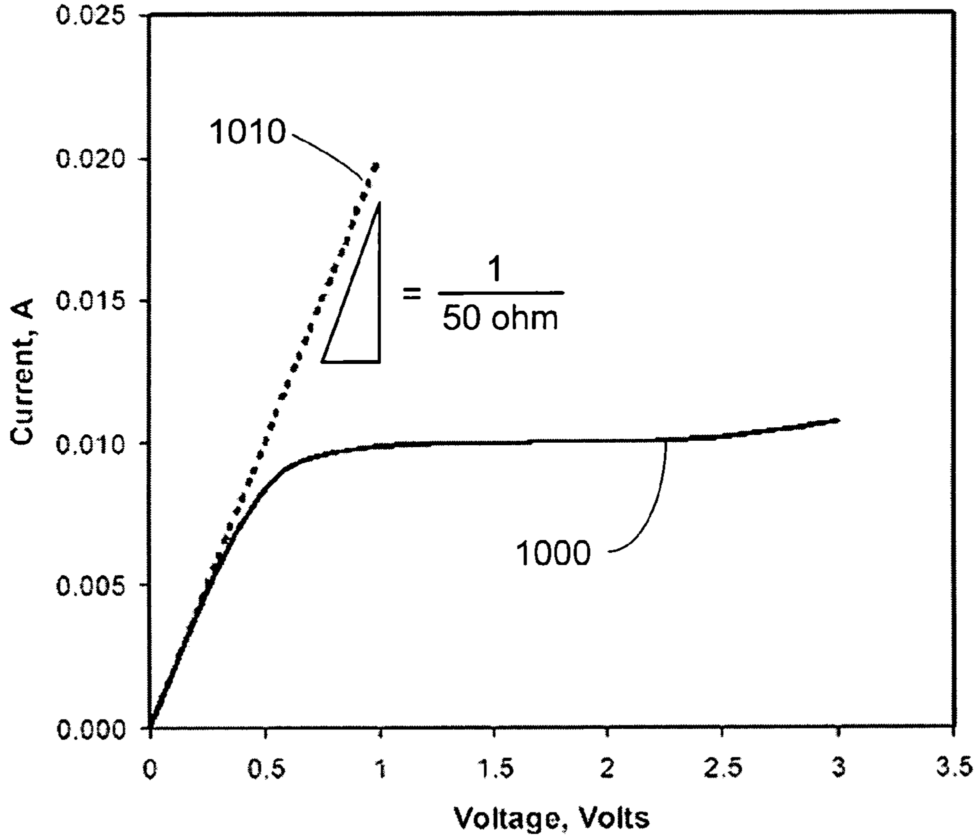
FIG. 10 illustrates the measured current-voltage characteristic of ungated FET used as a current limiting means.

FIG. 10 illustrates the measured current-voltage characteristic of the ungated FET used as the current limiting means. The current-voltage response 1000 of the ungated FET exhibits linear behavior below about 0.5 V. The I-v response of a 50 Ω resistor is illustrated in FIG. 10 by reference 1010. Comparison of the two responses indicates that the ungated FET behaves like a 50 Ω resistor at voltages less than about 0.5 V. FIG. 10 also indicates that the drain current of the FET that is delivered to the base of the HBT is limited to a maximum of about 10 mA, which is about 1.88 times the nominal base current, $I_{Bnom}$, of about 5.3 mA.

Figure 11:
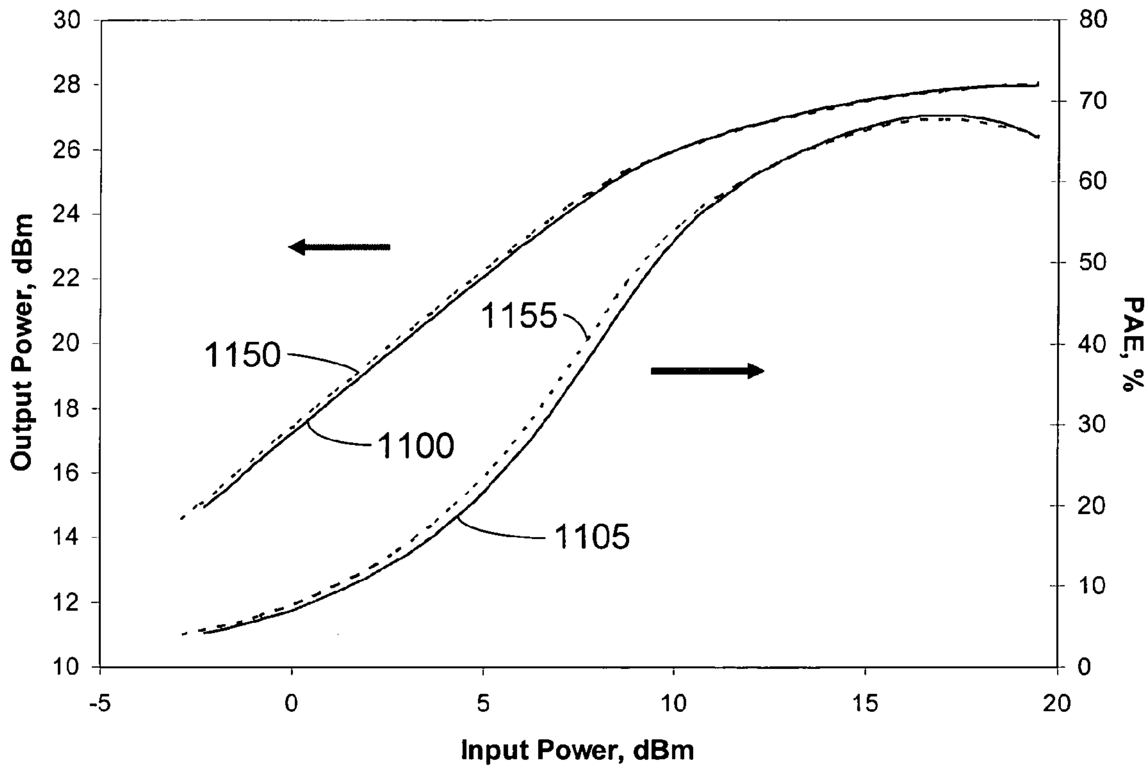
FIG. 11 illustrates the characteristics of the standard amplification stage and the FET current-limited amplification stage.

FIG. 11 illustrates the characteristics of the standard amplification stage and the FET current-limited amplification stage. In FIG. 11, the measured output power of the standard amplification stage 1150 and the measured output power of the FET current-limited amplification stage 1100 indicate that the power characteristics of the two amplification stages are very similar. The estimated power added efficiency (PAE) for the standard amplification stage 1155 and the FET current-limited amplification stage 1150 also indicate very similar behavior. The output power measurements were made under matched load and a 50 Ω source impedance, $V_{in}$=1.55 V, and $V_{out}$=3.5 V.

Figure 12:
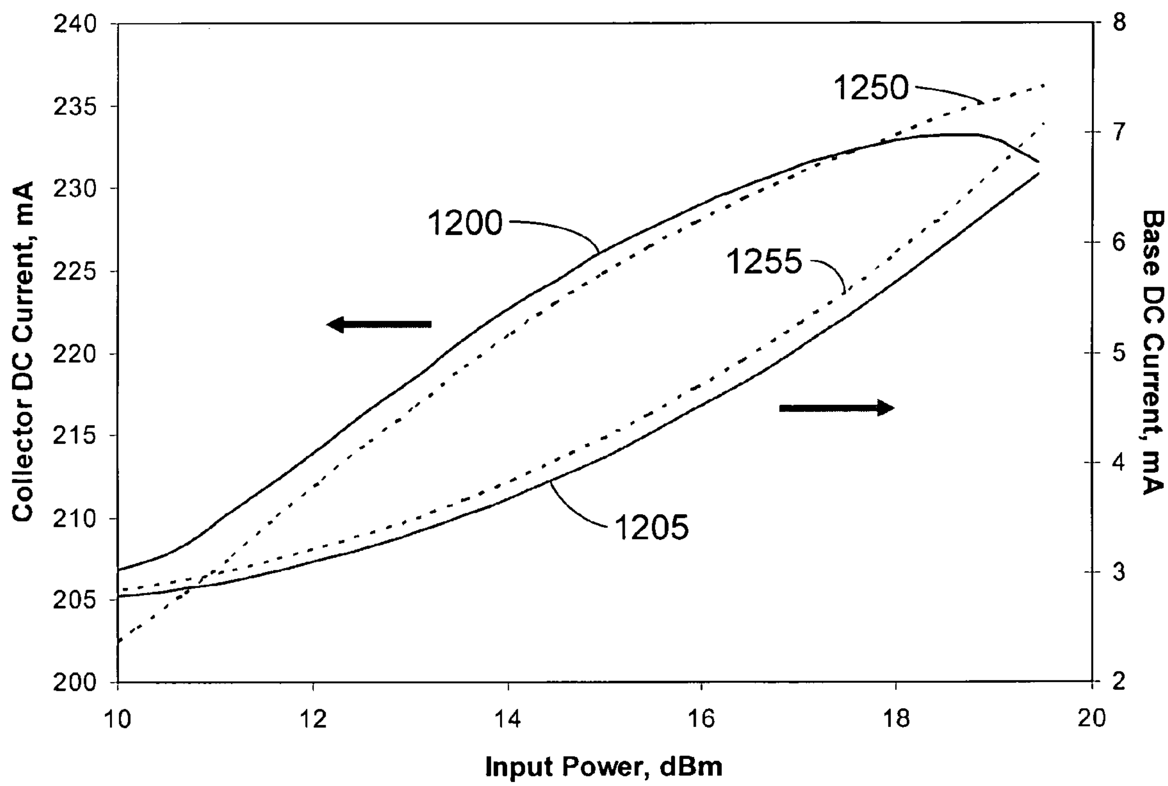
FIG. 12 illustrates the collector and base currents for the standard amplification stage and the FET current-limited amplification stage.

FIG. 12 illustrates the collector and base currents for the standard amplification stage and the FET current-limited amplification stage. Comparison of the collector current for the standard amplification stage 1250 and the collector current for the FET current-limited amplification stage 1200 indicates that the FET current-limited amplification stage reduces the collector current only at high power levels. Similarly, a comparison of the base current for the standard amplification stage 1255 and the base current for the FET current-limited amplification stage 1205 indicates that the FET current-limited amplification stage reduces the base current only at high power levels.

Figure 13:
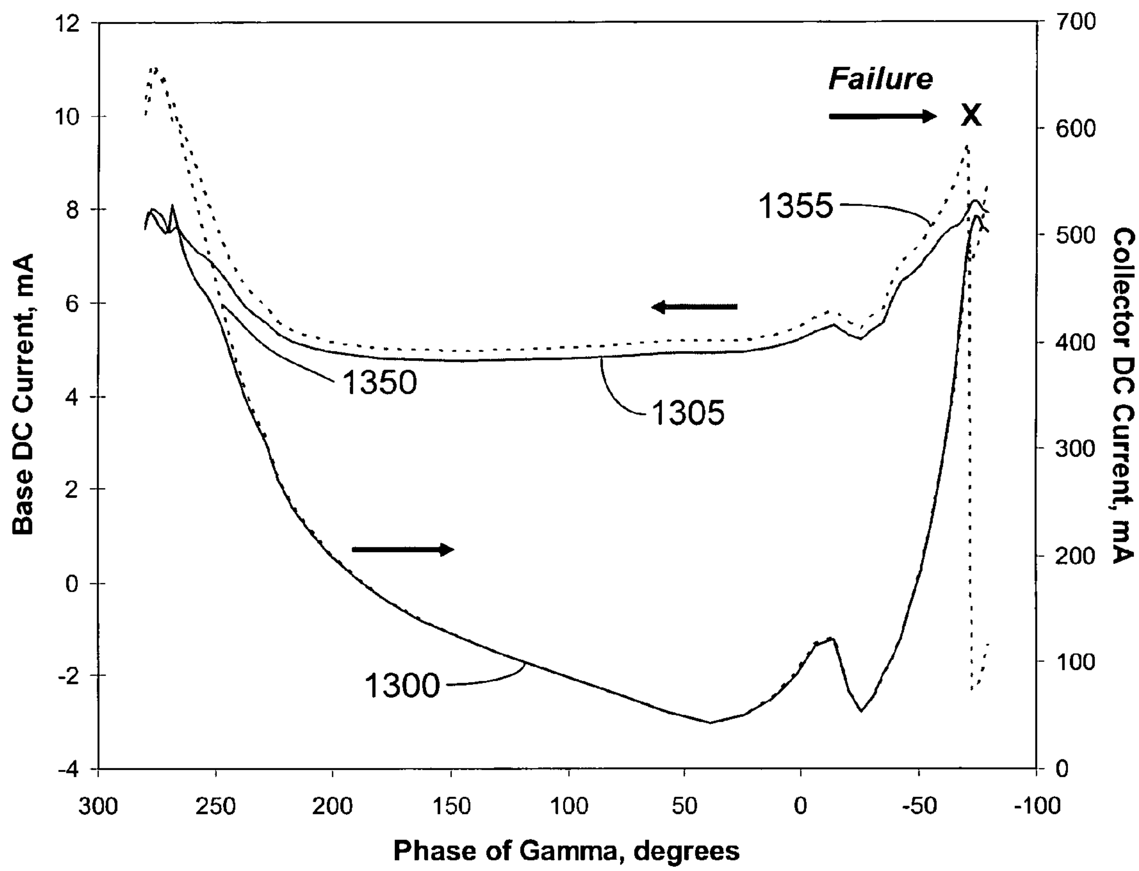
FIG. 13 illustrates the collector and base currents as a function of reflection coefficient phase.

FIG. 13 illustrates the collector and base currents as a function of reflection coefficient phase. The base and collector currents illustrated in FIG. 11 were measured using an input power of 20 dBm, $V_{in}$=1.55 V, $V_{out}$=4 V, and $|\Gamma|$=0.781, which corresponds to a VSWR of about 8.1:1. Comparison of the collector current for the standard amplification stage 1350 and the collector current for the FET current-limited amplification stage 1300 indicates that the maximum current of FET current-limited amplification stage is less than the maximum collector current of the standard amplification stage. Similarly, a comparison of the base current for the standard amplification stage 1355 and the base current for the FET current-limited amplification stage 1305 indicates that the maximum base current of the FET current-limited amplification stage is less than the maximum base current of the standard amplification stage.

Furthermore, FIG. 13 indicates that the FET current-limited amplification stage prevented failure of the HBT. In contrast, the HBT in the standard amplification stage failed at a phase of −71°. Overall, the FET current-limited amplification stage exhibited about 0.5 V higher failure voltage than the standard amplification stage. The failure voltage is the output voltage where the HBT fails.

EXAMPLE 2

Three stage quad-band power amplifiers with integrated power control were fabricated to evaluate FET current-limited designs. Four designs were fabricated for evaluation. A control design was fabricated with no current limiting FET. The second design, designated F1, was fabricated with each HBT ballasted and biased through a 7.5 μm FET resulting in a base current limited to 67.5 mA and a collector current limited to 0.5 A. In the third design, designated F2, each HBT was ballasted and biased through a 10 μm FET and a 133 Ω resistor resulting in a base current limited to 90 mA and a collector current limited to 0.68 A. The fourth design, designated F3, was fabricated with each HBT bank of 1200 $\mu m^2$ ballasted and biased through a 100 μm FET and each HBT ballasted with a 133 Ω resistor.

The performance of each design is summarized in Table 1 below. The performances of all four designs are similar and all designs satisfy the commercial GSM power amplifier specification.

TABLE 1

Performance of GSM power amplifiers

| Parameter | Control | F1 | F2 | F3 |
|---|---|---|---|---|
| Pset, dBm | 34.46 | 34.49 | 34.5 | 34.48 |
| Icc3 at Pset, mA | 405.57 | 392.31 | 401.56 | 400.19 |
| PAE at Pset, % | 49.27 | 51.27 | 50.19 | 50.21 |
| Vapc at Pset, V | 1.36 | 1.39 | 1.4 | 1.38 |
| 2nd harmonic at Pset, dBm | −18.69 | −15.64 | −18.65 | −17.06 |
| 3rd harmonic at Pset, dBm | −28.85 | −28.56 | −26.65 | −28.88 |
| Return loss, dB | −14.4 | −13.67 | −13.37 | −15.78 |
| Pmax, dBm | 35.57 | 35.41 | 35.36 | 35.49 |
| Icc3 at Pmax, mA | 451.34 | 441.29 | 443.92 | 446.49 |
| PAE at Pmax, % | 57.14 | 56.3 | 55.43 | 56.79 |
| Vapc at Pmax, V | 1.6 | 1.6 | 1.6 | 1.6 |
| 2nd harmonic at Pmax, dBm | −17.34 | −14.6 | −16.99 | −15.76 |
| 3rd harmonic at Pmax, dBm | −28.19 | −28.28 | −26.19 | −28.51 |

Each design was subjected to a 10:1 mismatched load to the amplifier output under maximum drive. The battery voltage was increased until the power amplifier failed and the output voltage at failure is presented in Table 2 below. In Table 2, $V_{ramp}$ is the power control voltage where the HBT is shut off when $V_{ramp}$=0 and delivers maximum power when $V_{ramp}$=1.6 V. Table 2 indicates that the current-limited FET designs were all superior to the control design with failure voltages of over twice the failure voltage of the control.

TABLE 2

Failure performance of GSM power amplifiers

| Design | Failure Voltage @ Vramp = 1.6; RT | Ic3max, A @ T = 25 C. | Failure Voltage @ Vramp = 1.6; T = −20 C. | Ic3max, A @ T = −20 C. |
|---|---|---|---|---|
| control | 4.5 V, typically | 0.8 | 3.8 V, typically | |
| F1 | 9.5 V (mod. 1 & 2) | 0.45 | 9.5 V (mod. 1) | 0.49 |
| F2 | 9.5 V (mod. 1 & 2) | 0.58 | 9.5 V (mod. 1) | 0.65 |
| F3 | 9.5 V (mod. 1 & 2) | 0.67 | 8 V (mod. 1) | 0.8 |

Figure 14A:
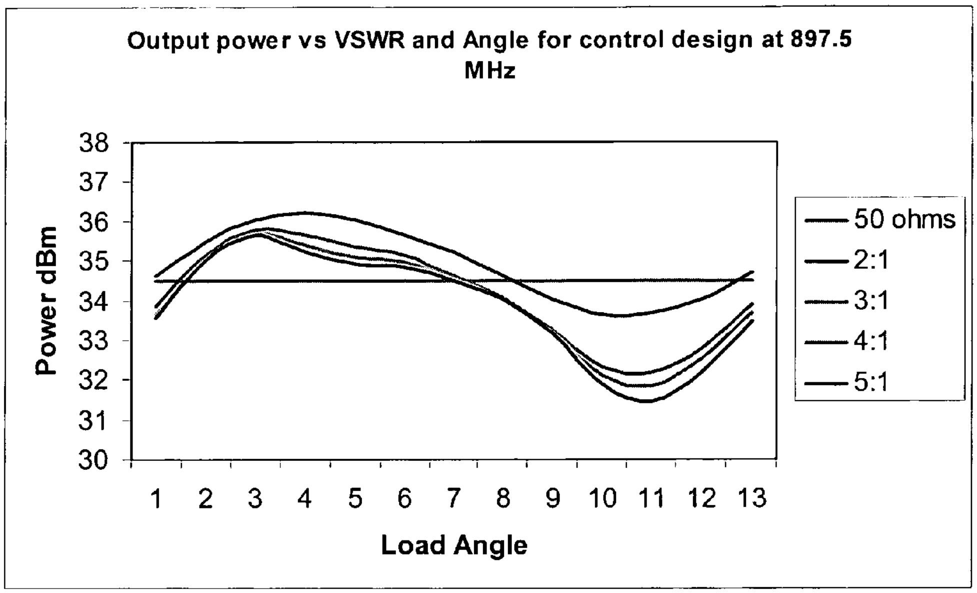
FIG. 14*a* illustrates the output power as a function of load angle and load mismatch for the control design.
Figure 14B:
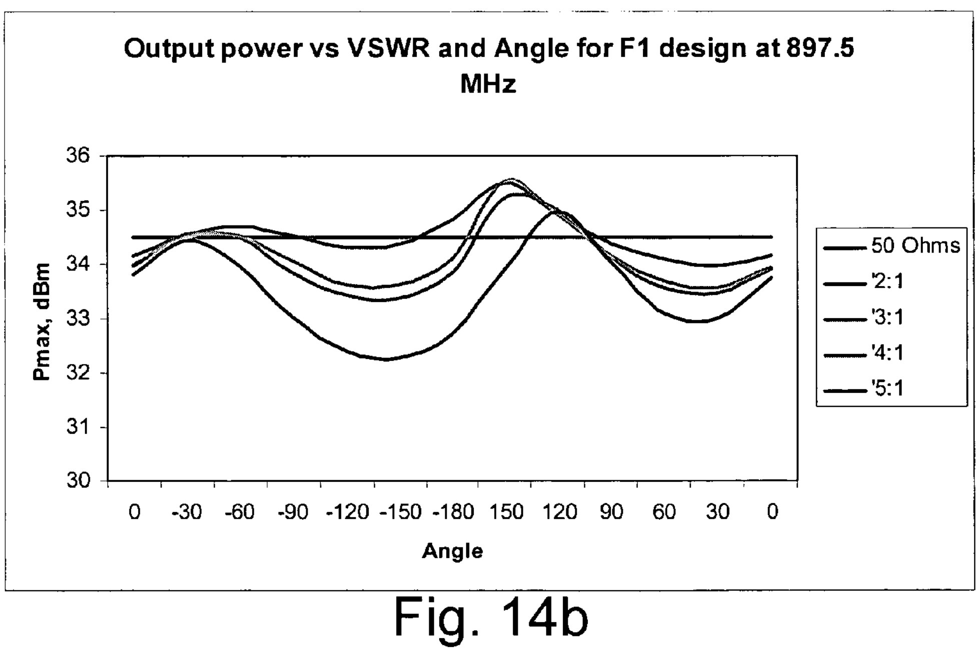
FIG. 14*b* illustrates the output power as a function of load angle and load mismatch for the F1 design.

FIG. **14*a* illustrates the output power as a function of load angle and load mismatch for the control design. FIG. 14*b* illustrates the output power as a function of load angle and load mismatch for the F1 design. Comparison of FIGS. 14*a* and 14*b*** indicates that the current-limited FET design exhibits less output power variation as a function of load angle than the control design.

Figure 15A:
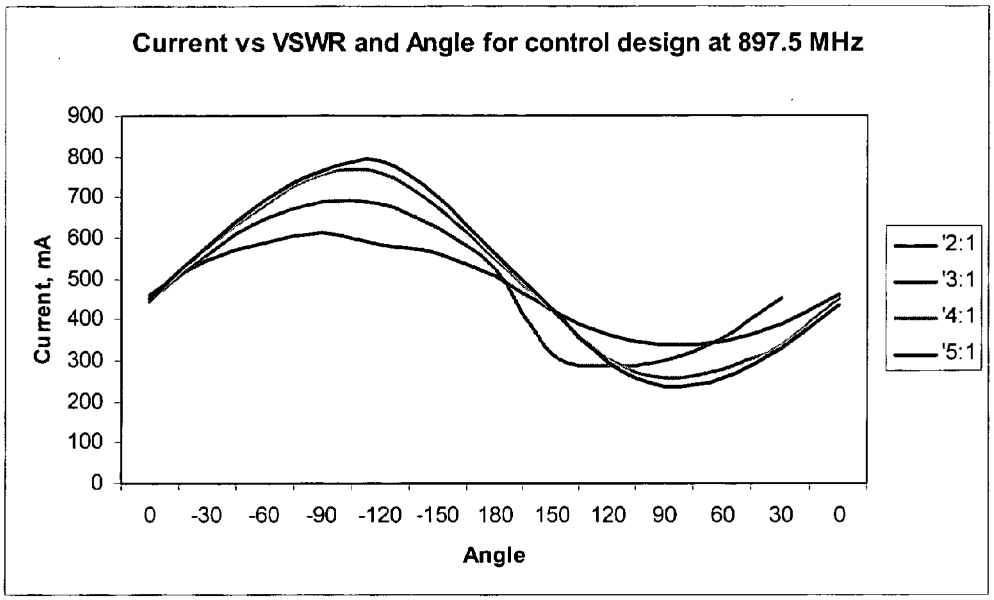
FIG. 15*a* illustrates the output current as a function of load angle and load mismatch for the control design.
Figure 15B:
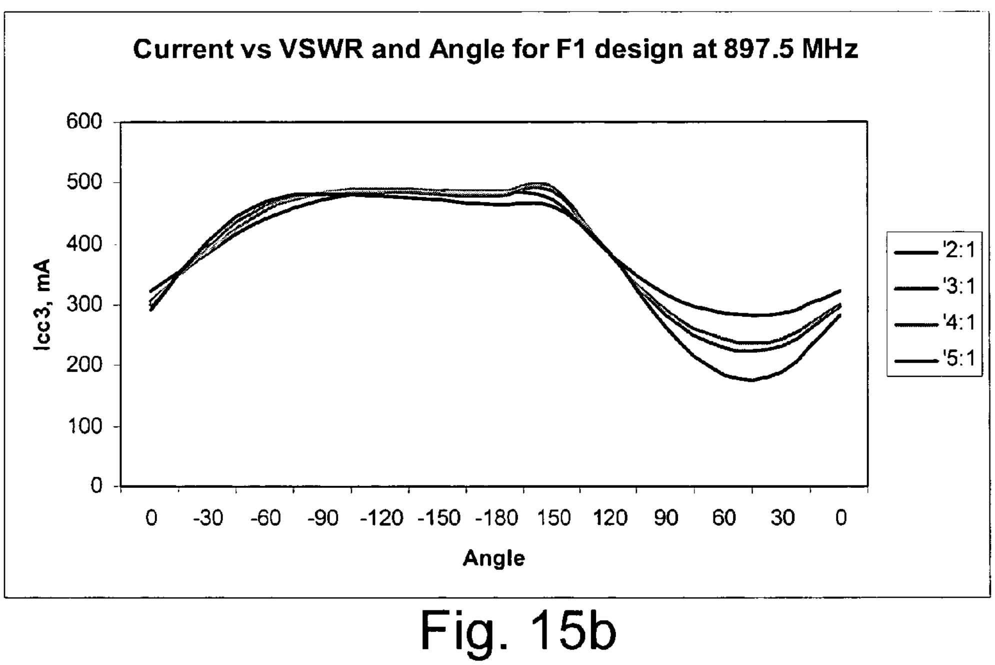
FIG. 15*b* illustrates the output current as a function of load angle and load mismatch of the F1 design.

FIG. **15*a* illustrates the output current as a function of load angle and load mismatch for the control design. FIG. 15*b* illustrates the output current as a function of load angle and load mismatch of the F1 design. Comparison of FIGS. 15*a* and 15*b*** indicates that the current-limited FET design exhibits less output current variation as a function of load angle than the control design. Furthermore, the maximum output current of the current-limited FET design is significantly less than the maximum output current of the control design.

Figure 16:
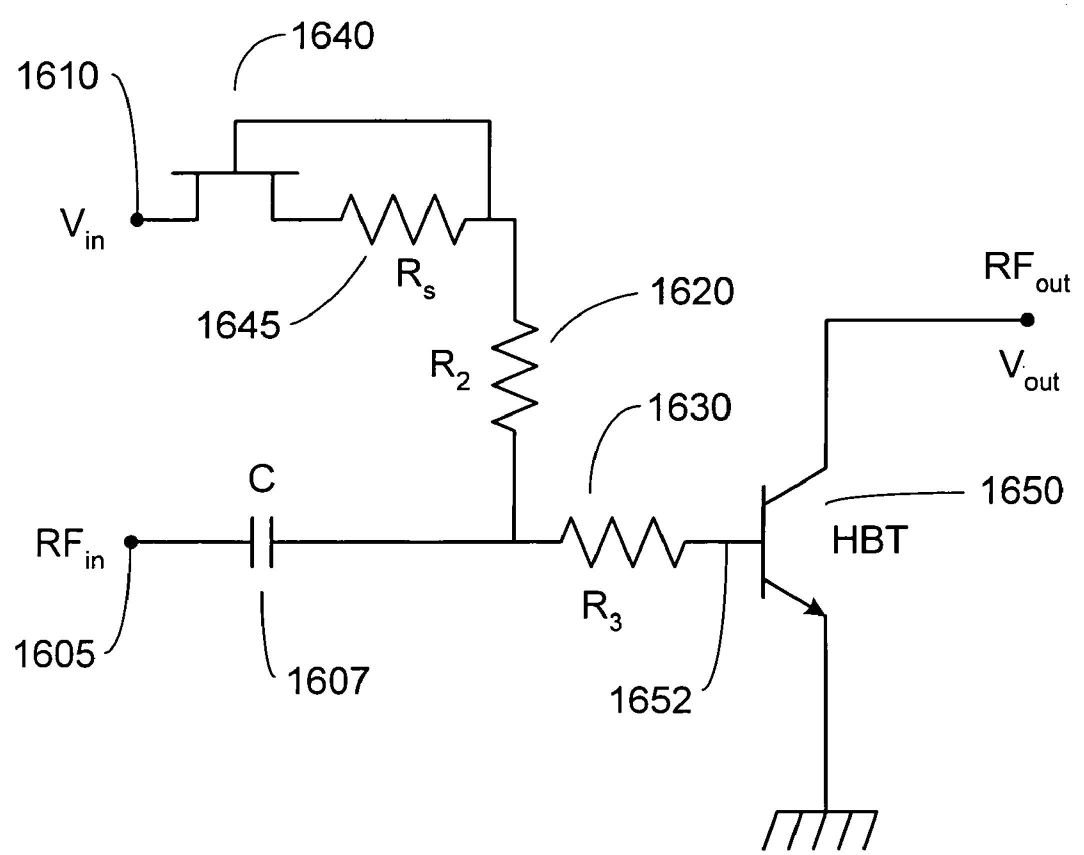
FIG. 16 is a circuit schematic of an HBT amplification stage in another embodiment of the present invention.

FIG. 16 is a circuit schematic of an HBT amplification stage in another embodiment of the present invention. In FIG. 16, the base 1652 of the HBT 1650 is biased with constant voltage at terminal 1610, $V_{IN}$, through FET 1640, source resistor 1645, $R_S$, and distributed ballast resistor 1620, $R_2$. Input RF power 1605 is supplied through blocking capacitor 1607 separating the DC and RF input lines. An additional distributed resistor 1630, $R_3$, may be placed in the RF path of the base for stability.

The FET shown in FIG. 16 may be a MOSFET but other types of field effect transistor, such as for example MESFETs or HEMTs, may be used and are within the scope of the present invention. In some embodiments, the physical characteristics of the FET, such as for example channel dimensions, gate characteristics, and doping levels, may be selected to set the effective resistance of the FET 1640 when operated in the linear region of operation. In some embodiments, the effective resistance of the FET 1640 is set to limit the base current to the HBT 1650 to a design nominal value, $I_{Bnom}$, such that the HBT is biased properly.

In some embodiments, the width of the FET channel is selected to set the maximum allowed DC current, $I_{Dss}$, through the FET using methods known to one of skill in the semiconductor device art. In a preferred embodiment, $I_{Dss}$ is set such that $I_{Dss}$ is in the range of one to two times larger than $I_{Bnom}$. Setting $I_{Dss}$ larger than $I_{Bnom}$ avoids degrading performance during nominal operation. Setting $I_{Dss}$ less than $2*I_{Bnom}$ prevents uncontrolled current increases during mismatch or overdrive conditions, thereby preventing irreversible damage to the HBT 1650.

In FIG. 16, source resistor 1645 is placed between the gate and source of the FET 1640 that negatively biases the gate with respect to the source of the FET. The source resistor 1645 creates a voltage drop between the gate and source of the FET 1640 that depends, in part on the current through the FET 1640. Source resistor 1645 is added to reduce variations in $I_{Dss}$ caused by process or growth variations during the fabrication of the FET. If, during fabrication, the $I_{Dss}$ for the FET is larger than a desired $I_{Dss}$, the larger current will produce a larger voltage drop across $R_S$ thereby creating a more negative gate potential relative to the source of the FET. The negative gate bias reduces the current through the FET. Similarly, if $I_{Dss}$ is less than a desired $I_{Dss}$, the current through $R_S$ will be less than the desired current resulting in a lower voltage drop across $R_S$. The lower voltage drop across $R_S$ results in a less negative gate potential relative to the source of the FET. The smaller negative gate bias increases the current through the FET.

In a preferred embodiment $R_S$ is selected such that $R_{on}+R_S=R_1$. It should be understood that use of a source resistance, or other passive or active circuits that may readily occur to those skilled in the art, to desensitize the FET base current limit from fabrication variations may be applied to any of the gated FET configurations described herein and should not be limited to the configuration shown in FIG. 16.

FET 1640 is preferably fabricated on the same die as HBT 1650 for a monolithic amplifier design of reduced size and manufacturing cost compared to designs where the FET and HBT are fabricated on separate dies.

Having thus described illustrative embodiments of the invention, various modifications and improvements will readily occur to those skilled in the art and are intended to be within the scope of the invention. Alternative additional embodiments, such as those with additional amplification stages or different types of composite transistors, or compound semiconductor devices, or protection for fewer than all stages, and the like should be understood to be covered by the invention as limited only by the appended claims. The principles described herein are also applicable to silicon technology, e.g., Si or SiGe BiCMOS. Accordingly, the foregoing description is by way of example only and is not intended as limiting. The invention is limited only as defined in the following claims and the equivalents thereto.

What is claimed:

1. A monolithically integrated amplifier comprising:

a heterojunction bipolar transistor (HBT) comprising a contact epitaxial layer; and a field effect transistor (FET) configured to current-limit a current to the HBT, the FET comprising a portion of the contact epitaxial layer.

2. The monolithically integrated amplifier of claim 1 wherein the FET is configured to current-limit a base current to the HBT.

3. The monolithically integrated amplifier of claim 2 wherein the FET is un-gated.

4. The monolithically integrated amplifier of claim 2 wherein the FET is gated.

5. The monolithically integrated amplifier of claim 2 wherein a source of the FET is in electrical communication with a gate of the FET through a source resistor.

6. The monolithically integrated amplifier of claim 2 wherein a channel width of the FET is selected to limit the base current to less than $1_{Bsat}$ where $1_{Bsat}<2*1_{Bnom}$ where $1_{Bnom}$ is a nominal base current.

7. The monolithically integrated amplifier of claim 6 wherein the channel width of the FET is selected such that $1_{Bsat}>1_{Bnom}$.

8. The monolithically integrated amplifier of claim 1 wherein the FET is configured to current-limit a collector current to the HBT.

9. The monolithically integrated amplifier of claim 8 wherein the FET is un-gated.

10. The monolithically integrated amplifier of claim 8 wherein the FET is gated.

11. The monolithically integrated amplifier of claim 8 further comprising a source resistor electrically connecting a source of the FET to a gate of the FET.

12. The monolithically integrated amplifier of claim 1 wherein the FET is configured in series with an RE connection to a collector of the HBT.

13. The monolithically integrated amplifier of claim 12 wherein the FET is un-gated.

14. The monolithically integrated amplifier of claim 12 wherein the FET is gated.

15. The monolithically integrated amplifier of claim 12 further comprising a source sistor connecting a source of the FET to a gate of the FET.

16. The monolithically integrated amplifier of claim 1 wherein the FET is selected from a group comprising MOSFET, MESFET, pHEMT and HEMT.

17. A monolithically integrated amplifier comprising:

a heteojunction bipolar transistor (HBT) comprising at least one HBT cell, the HBT cell comprising a contact epitaxial layer; and a field effect transistor (FET) configured to current-limit a current to the at least one HBT cell, the FET comprising a portion of the contact epitaxial layer.

18. The monolithically integrated amplifier of claim 17 wherein the FET is configured to current-limit a base current to the at least one HBT cell.

19. The monolithically integrated amplifier of claim 17 wherein the FET is configured to current-limit a collector current to the at least one HBT cell.

20. The monolithically integrated amplifier of claim 17 wherein the FET is configured in series with an RF connection to a collector of the at least one HBT cell.

21. The monolithicalyy integrated amplifier of claim 17 further comprising a source resistor connecting a gate of the FET to a source of the FET.

22. A method for protecting an amplifier comprising a heterojunction bipolar transistor by providing a monolithically integrated field effect transistor to limit the current flowing through the heterojunction bipolar transistor to a predetermined current, wherein the monolithically integrated field effect transistor behaves substantially as a resistor during normal operation of the amplifier.

23. The method of claim 22 wherein the monolithically integrated field effect transistor reduces a variation of output power to a change in load phase.

24. The method of claim 22 further comprising biasing a gate voltage of the field effect transistor negatively with respect to a source voltage of the field effect transistor such that the negatively biased gate voltage depends at least in part on a current through the field effect transistor.

25. A method for reducing collector current variations to a change in load phase in an amplifier comprising a heterojunction bipolar transistor, the method comprising the steps of: providing a monolithically integrated field effect transistor to limit the current flowing through the heterojunction bipolar transistor to a predetermined current, wherein the monolithically integrated field effect transistor behaves substantially as a resistor during normal operation of the amplifier.

* * * * *

UNITED STATES PATENT AND TRADEMARK OFFICE

CERTIFICATE OF CORRECTION

PATENT NO. : 6,998,920 B2 
APPLICATION NO. : 10/783825
DATED : February 14, 2006
INVENTOR(S) : Krutko et al.

It is certified that error appears in the above-identified patent and that said Letters Patent is hereby corrected as shown below:

At Column 9, line 43 of Claim 6 thereof, replace "$1_{Bsat}$ where $1_{Bsat}<2*1_{Bnom}$"

with -- $I_{BSat}$ where $I_{Bsat}<2*I_{Bnom}$ --.

At Column 9, line 44 of Claim 6 thereof, replace "$1_{Bnom}$" with --$I_{Bnom}$ --.

At Column 9, line 47 of Claim 7 thereof, replace "$1_{Bsat}>1_{Bnom}$" with -- $I_{Bsat}>I_{Bnom}$ --.

Signed and Sealed this

Twenty-second Day of August, 2006

JON W. DUDAS
*Director of the United States Patent and Trademark Office*